(12) United States Patent
Manabe et al.

(10) Patent No.: US 7,820,498 B2
(45) Date of Patent: Oct. 26, 2010

(54) BACKSIDE ILLUMINATED IMAGING SENSOR WITH LIGHT REFLECTING TRANSFER GATE

(75) Inventors: Sohei Manabe, San Jose, CA (US); Hsin-Chih Tai, Cupertino, CA (US); Vincent Venezia, Sunnyvale, CA (US); Duli Mao, Sunnyvale, CA (US); Yin Qian, Milpitas, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 156 days.

(21) Appl. No.: 12/199,737

(22) Filed: Aug. 27, 2008

(65) Prior Publication Data

US 2009/0200588 A1 Aug. 13, 2009

Related U.S. Application Data

(60) Provisional application No. 61/027,343, filed on Feb. 8, 2008.

(51) Int. Cl.
H01L 21/00 (2006.01)
(52) U.S. Cl. ...................................... 438/149
(58) Field of Classification Search ........................ None
See application file for complete search history.

(56) References Cited

U.S. PATENT DOCUMENTS

| | | | | |
|---|---|---|---|---|
| 4,875,084 A | * | 10/1989 | Tohyama | 257/436 |
| 5,514,888 A | * | 5/1996 | Sano et al. | 257/232 |
| 6,169,319 B1 | * | 1/2001 | Malinovich et al. | 257/447 |
| 6,606,124 B1 | * | 8/2003 | Hatano et al. | 348/311 |
| 6,642,087 B2 | * | 11/2003 | Nozaki et al. | 438/149 |

* cited by examiner

Primary Examiner—Charles D Garber
Assistant Examiner—Andre' C Stevenson
(74) Attorney, Agent, or Firm—Blakely Sokoloff Taylor & Zafman LLP

(57) ABSTRACT

A backside illuminated imaging sensor includes a semiconductor having an imaging pixel that can include a photodiode region, an insulation layer, and a reflective layer. The photodiode is typically formed in the frontside of the semiconductor substrate. A surface shield layer can be formed on the frontside of the photodiode region. A light reflecting layer can be formed using silicided polysilicon on the frontside of the sensor. The photodiode region receives light from the back surface of the semiconductor substrate. When a portion of the received light propagates through the photodiode region to the light reflecting layer, the light reflecting layer reflects the portion of light received from the photodiode region towards the photodiode region. The silicided polysilicon light reflecting layer also forms a gate of a transistor for establishing a conductive channel between the photodiode region and a floating drain.

14 Claims, 4 Drawing Sheets

BACKSIDE ILLUMINATED IMAGING SENSOR WITH LIGHT REFLECTING TRANSFER GATE

CROSS-REFERENCE TO RELATED APPLICATION

This application claims the benefit of U.S. Provisional Application No. 61/027,343, filed on Feb. 8, 2008, the contents of which are incorporated herein by reference.

TECHNICAL FIELD

This disclosure relates generally to imaging sensors, and in particular but not exclusively, relates to backside illuminated imaging sensors.

BACKGROUND INFORMATION

Many semiconductor imaging sensors today are frontside illuminated. That is, they include imaging arrays that are fabricated on the frontside of a semiconductor wafer, where light is received at the imaging array from the same frontside. However, frontside illuminated imaging sensors have many drawbacks, one of which is a relatively limited fill factor.

Backside illuminated imaging sensors are an alternative to frontside illuminated imaging sensors and address the fill factor problems associated with frontside illumination. Backside illuminated imaging sensors typically include imaging arrays that are fabricated on the front surface (or frontside) of the semiconductor wafer, but receive light through a back surface of the wafer. However, to detect light from the backside, the silicon wafer on the backside is relatively thin. Color filters and micro-lenses can be included on the back surface of the wafer in order to improve the sensitivity of the backside illuminated sensor. The thickness of the wafer may also be reduced in order to improve the sensitivity to light (especially shorter wavelengths). However, higher sensitivity typically results in higher optical crosstalk. That is, as the semiconductor wafer is thinned, light can more easily pass through the wafer and light intended for one pixel might be reflected within the image sensor to other pixels that were not intended to receive the light. Thus, improving sensitivity and reducing optical crosstalk can improve the signal quality of a backside illuminated sensor.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of a Backside Illuminated Imaging Sensor with Light Reflecting Transfer Gate are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
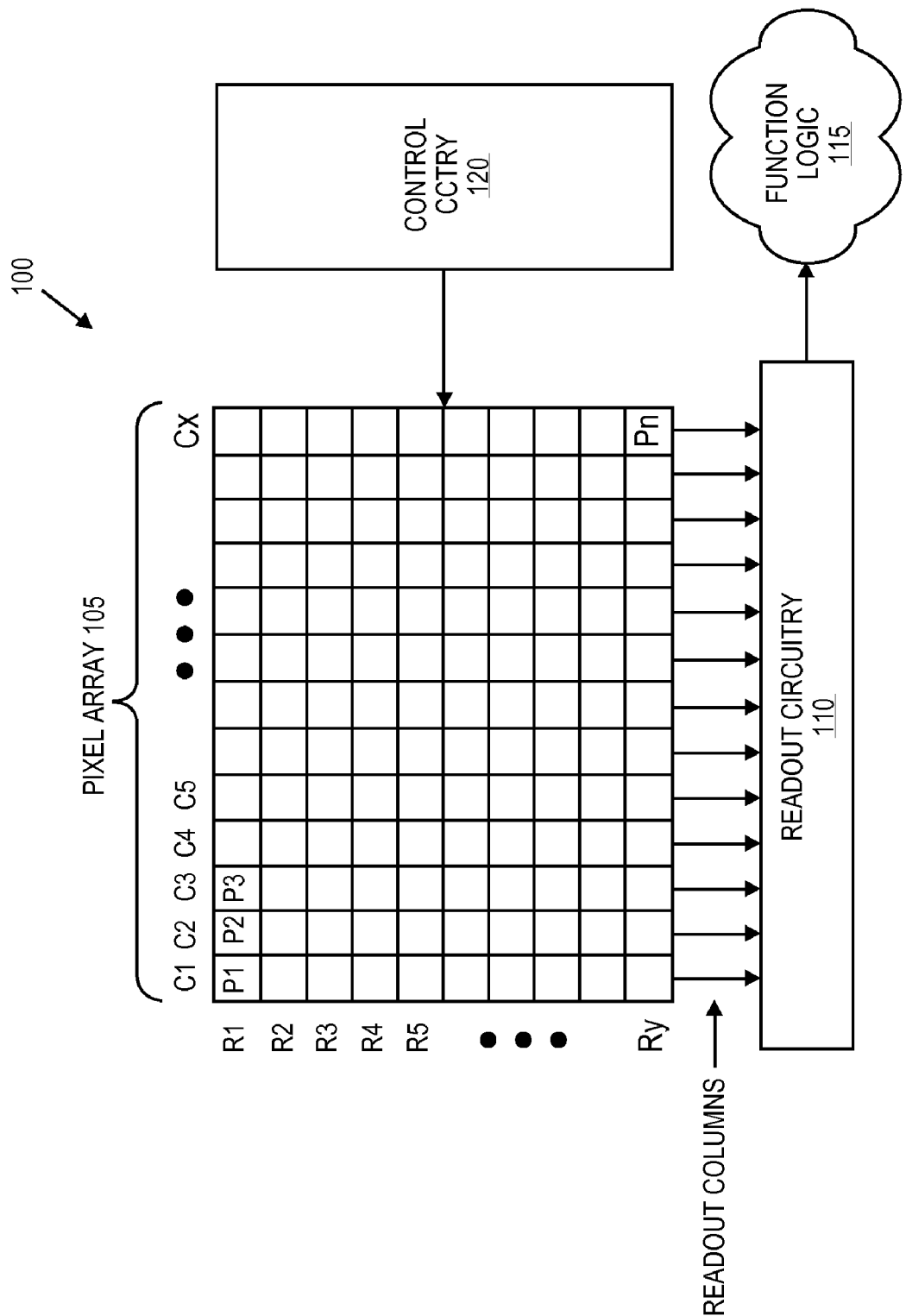
FIG. 1 is a block diagram illustrating a backside illuminated imaging sensor, in accordance with an embodiment of the invention.

FIG. 1 is a block diagram illustrating a backside illuminated imaging sensor 100, in accordance with an embodiment of the invention. The illustrated embodiment of imaging sensor 100 includes a pixel array 105, readout circuitry 110, function logic 115, and control circuitry 120.

Pixel array 105 is a two-dimensional ("2D") array of backside illuminated imaging sensors or pixels (e.g., pixels P1, P2 . . . , Pn). In one embodiment, each pixel is an active pixel sensor ("APS"), such as a complementary metal-oxide-semiconductor ("CMOS") imaging pixel. As illustrated, each pixel is arranged into a row (e.g., rows R1 to Ry) and a column (e.g., column C1 to Cx) to acquire image data of a person, place, or object, which can then be used to render a 2D image of the person, place, or object.

After each pixel has acquired its image data or image charge, the image data is readout by readout circuitry 110 and transferred to function logic 115. Readout circuitry 110 may include amplification circuitry, analog-to-digital conversion circuitry, or otherwise. Function logic 115 may simply storage the image data or even manipulate by applying post image effects (e.g., crop, rotate, remove red eye, adjust brightness, adjust contrast, or otherwise). In one embodiment, readout circuitry 110 may readout a row of image data at a time along readout column lines (illustrated) or may readout the image data using a variety of other techniques (not illustrated), such as a serial readout or a full parallel readout of all pixels simultaneously.

Control circuitry 120 is coupled to pixel array 105 to control operational characteristic of pixel array 105. For example, control circuitry 120 may generate a shutter signal for controlling image acquisition.

Figure 2:
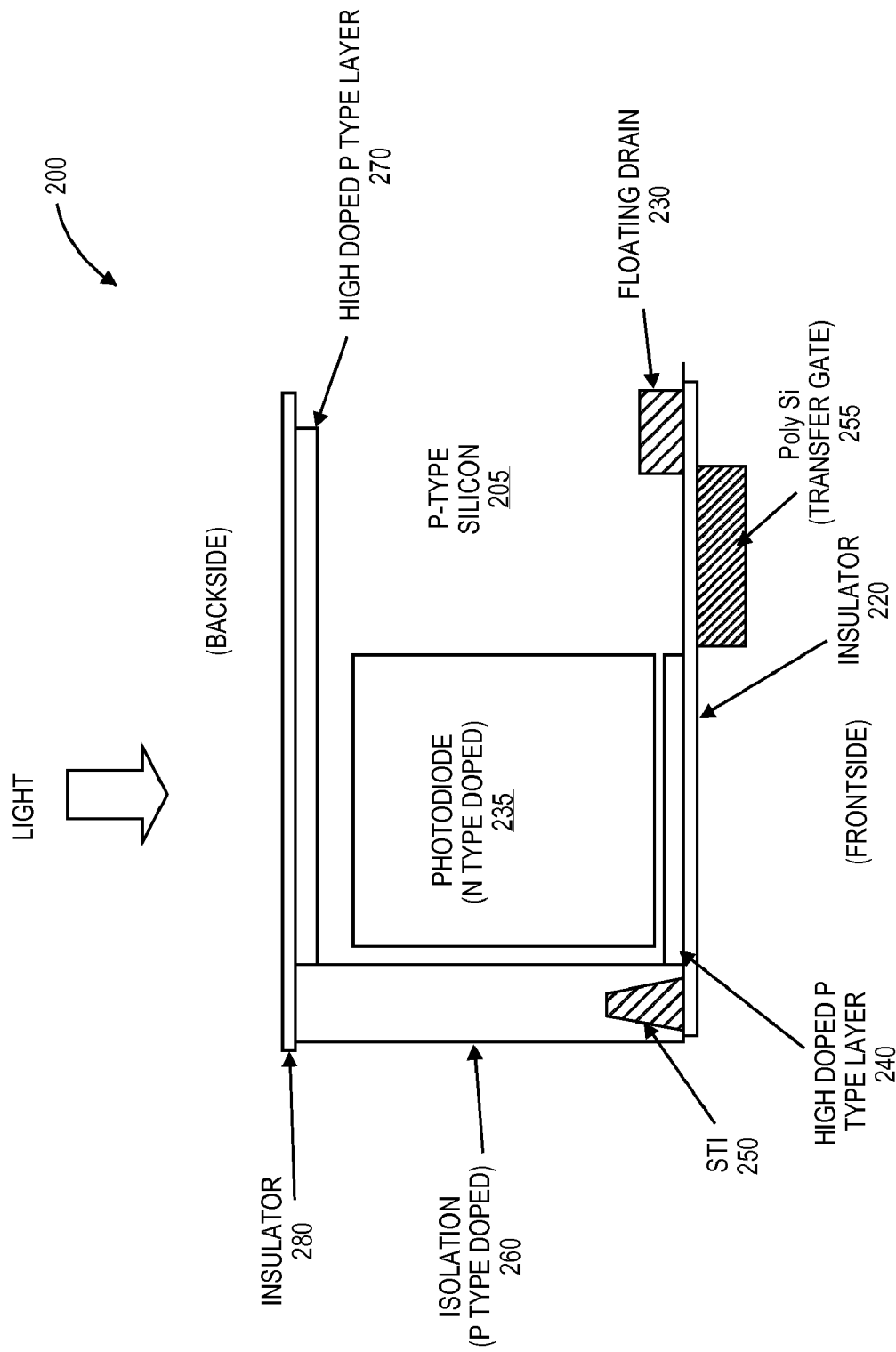
FIG. 2 is a cross-sectional view of a conventional imaging pixel of a backside illuminated imaging sensor.

FIG. 2 is a cross-sectional view of a conventional imaging pixel 200 of a backside illuminated imaging sensor. The illustrated embodiment of imaging pixel 200 includes a semiconductor substrate 205 that includes shallow trench isolations ("STI") 250, photodiode region 235, a floating drain 230, and a pinning layer 240. Also illustrated in FIG. 2 is a transfer gate 255 formed on insulator (gate oxide) 220.

In the illustrated embodiment of FIG. 2, photodiode region 235 is formed on a frontside of semiconductor substrate 205 (which is shown as being in the lower portions of FIG. 2) and is configured to receive light from a backside of semiconductor substrate 205. Photodiode region 235 is illustrated as a pinned photodiode by way of optional pinning layer 240. In an example, photodiode region 235 may be an unpinned photodiode or a partially pinned photodiode. Additionally, photodiode region 235 may be any photosensitive element, such as a photogate or photocapacitor. Furthermore, the term pixel as used herein is meant to encompass all pixel designs, including CCD pixels.

Also included in imaging pixel 200 is transfer gate 255 which is coupled to transfer charge that is accumulated in photodiode region 235 to floating drain 230. In one embodiment, transfer gate 255 is a polycrystalline silicon (i.e., polysilicon) structure.

As shown in FIG. 2, imaging pixel 200 includes a surface shield layer (such as highly doped P+ layer 270) that can be formed using, for example, ion implantation. An insulator 280 can be formed on the backside of substrate 205. Insulator 280 is generally transparent to light.

During operation, incident light is received at the back surface of substrate 205 and passes through substrate 205 to be received by photodiode region 235. Photodiode region 235 then generates one or more electrical signals in response to the received light where these electrical signals are routed through peripheral circuitry. However, a portion of the light received at photodiode region 235 may continue propagating through the front surface (e.g., at insulator 220) of substrate 205. In some instances this light continues into one or more of the intermetal dielectric layers (not shown) and is reflected by the metal layers (not shown) back towards a different (e.g., adjacent) pixel, where this different pixel now generates a new electrical signal in response to the reflected light. Light reflecting back to an adjacent or different pixel in this manner is referred to herein as "optical crosstalk" and increases noise and reduces the quality in the resulting image produced by a pixel array.

Optical cross talk can also occur from light incident on the frontside (or reflected by structures in the frontside) of the imaging pixel. The cross talk is typically greater for longer wavelengths of light. Thus, the quality of the image is reduced because incident light is often scattered from adjacent pixels. When the adjacent pixels are used to capture light of different colors, the scattered light can shift the color information captured by the pixels. In addition, the quality of the imaging pixels can be degraded due to etching of structures adjacent to the photodiode region. For example, gate polysilicon is typically deposited on the gate insulator, which is typically less than 100 angstroms. When gate polysilicon is etched by subsequent processing, adjacent photodiode regions are often damaged in the etching process. The etching can cause damage to the silicon above the photodiode region, which can result in increase current leakage and damaged and/or defective pixels.

A sample backside illuminated imaging sensor as disclosed herein includes a semiconductor having an imaging pixel that includes a photodiode region, a doped layer, and a silicided polysilicon reflective layer. The photodiode is formed in the frontside of the semiconductor substrate. A thin insulator layer is formed on the frontside of the photodiode region. A silicided polysilicon light reflecting layer formed on the frontside of the thin insulator layer such that the photodiode region receives light from the back surface of the semiconductor substrate. When a portion of the received light propagates through the photodiode region to the silicided polysilicon light reflecting layer, the silicided polysilicon light reflecting layer reflects the portion of light received from the photodiode region. The silicided polysilicon light reflecting layer and the thin insulating layer also forms a gate of a transistor for establishing a conductive channel between the photodiode region and a floating drain.

Figure 3:
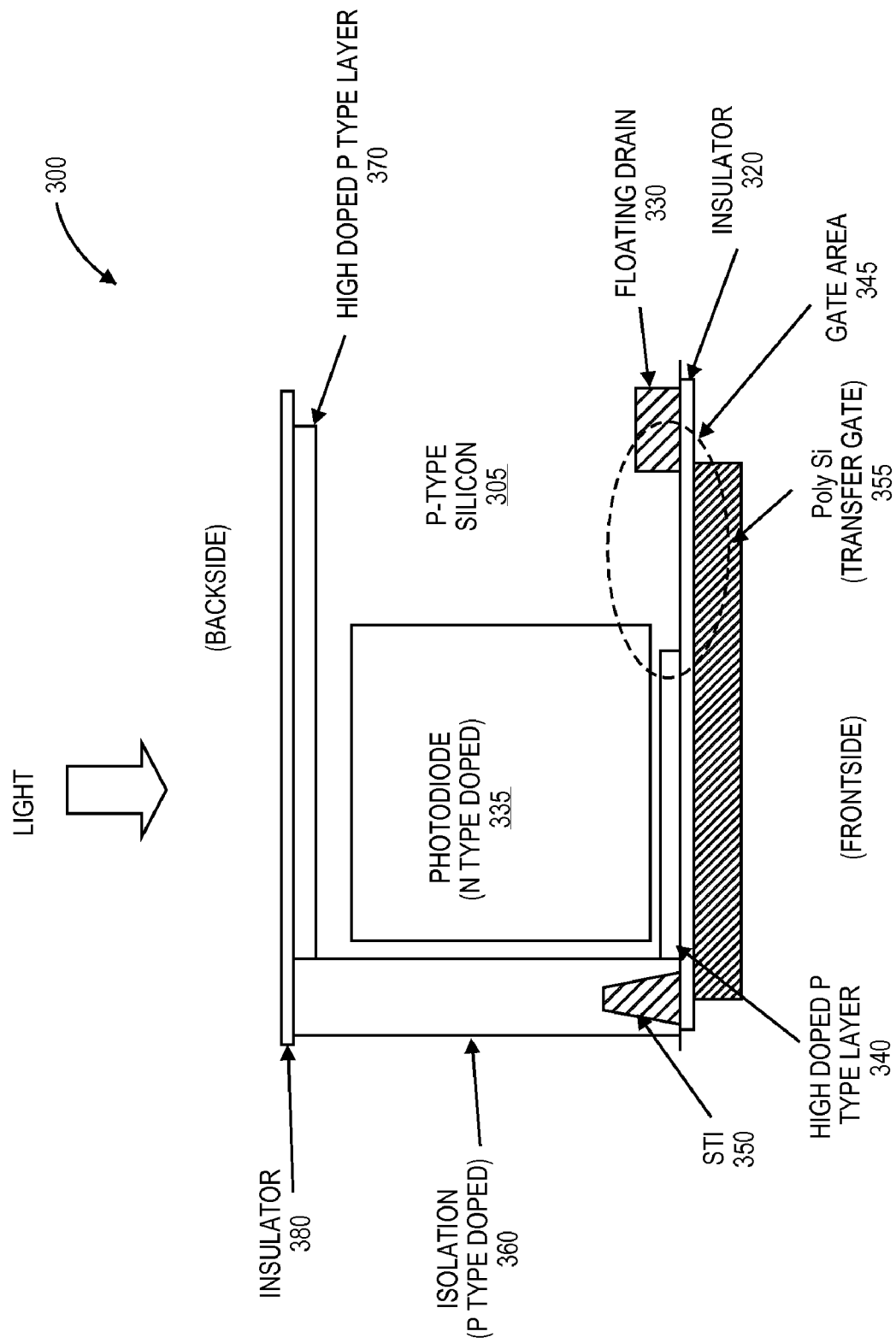
FIG. 3 is a cross-sectional view of a sample imaging pixel of a backside illuminated imaging sensor, in accordance with an embodiment of the invention.

FIG. 3 is a cross-sectional view of a sample imaging pixel 300 of a backside illuminated imaging sensor. The illustrated embodiment of imaging pixel 300 includes a semiconductor substrate 305 that includes including shallow trench isolations ("STI") 350, photodiode region 335, a floating drain 330, and a pinning layer 340. Also illustrated in FIG. 3 is a transfer gate 355 formed on insulator (gate oxide) 320.

In the illustrated embodiment of FIG. 3, photodiode region 335 is formed on a frontside of semiconductor substrate 305 (which is oriented towards the lower portions of FIG. 3) and is configured to receive light from a backside of semiconductor substrate 305. Photodiode region 335 is illustrated as a pinned photodiode by way of optional pinning layer 340. Pinning layer 340 extends partially across the frontside of the photodiode region.

Also included in imaging pixel 300 is transfer gate 355 which is coupled to transfer charge that is accumulated in photodiode region 335 to floating drain 330. The charge is transferred through an active channel that is established in gate area 345 when the transfer gate 355 is activated. In one embodiment, transfer gate 355 is a polycrystalline silicon (i.e., polysilicon) structure. As illustrated, the transfer gate 355 extends horizontally from STI 350, across pinning layer 340, to around floating drain 330. Thus, the entire frontside of the photodiode region 335 can be shielded by the transfer gate 355. The polysilicon of the transfer gate 355 works to prevent etching damage of the photodiode region 335 (that would likely occur if the polysilicon was etched through). Thus, the leakage current from the photodiode region 335 is reduced because of a relative lack of defects associated with processing of the frontside of the photodiode region 335.

Additionally, cross talk is reduced by the extended transfer gate 355. Silicide is formed on the polysilicon, which is not transparent. Instead, incident light entering from the backside that encounters silicided polysilicon (such as the extended transfer gate 355 discussed above) is reflected. Light that enters from the backside and traverses the photodiode region 335 (without being absorbed) is thus reflected back into the photodiode region 335 by the silicided polysilicon of extended transfer gate 355. When the light is reflected back into the photodiode region 335, the chances of photon absorption (and concomitant charge generation) are increased. Thus, a decreased depth of the photodiode region 335 does not necessarily result in decreased sensitivity because the unabsorbed light can be reflected back into the photodiode region 335 for more likely absorption.

Moreover, cross talk is reduced because the polysilicon layer of the transfer gate 355 is formed in a region that is relatively close to the photodiode region 335. The relative closeness helps to prevent light rays of high angles of incidence (including oblique light rays) from being reflected from adjacent pixels into an adjacent (unintended) pixel. Thus, incident light from the backside on the pixel is more likely to be absorbed by the photodiode region 335 and light incident and/or reflected by metal structures in the frontside are less likely to be absorbed by the photodiode region 335.

As shown in FIG. 3, imaging pixel 300 includes a surface shield layer (such as highly doped P+ layer 370) that can be formed using, for example, ion implantation. An insulator 380 can be formed on the backside of substrate 305. Insulator 380 is generally transparent to light.

Figure 4:
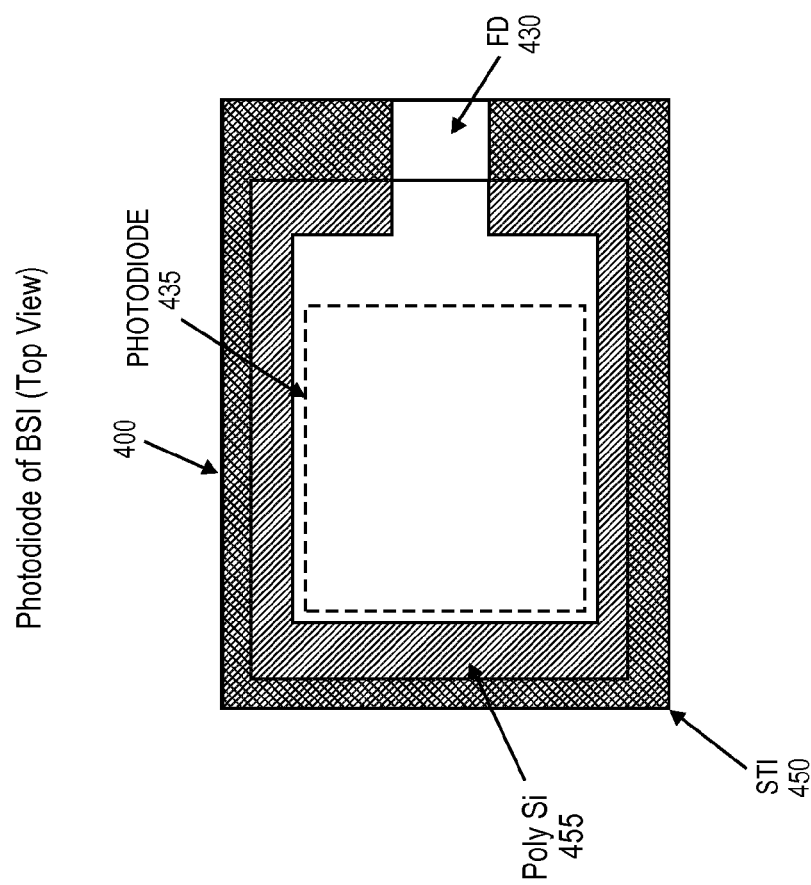
FIG. 4 is a top view of an imaging pixel of a backside illuminated imaging sensor, in accordance with an embodiment of the invention.

FIG. 4 is a top view of an imaging pixel 400 of a backside illuminated imaging sensor, in accordance with an embodiment of the invention. As illustrated, a "C"-shaped isolation region (e.g., STI 450) nearly surrounds photodiode region 435, while a floating drain 430 occupies a region between the ends of the "C"-shaped isolation region. A polysilicon layer 455 is shown as overlying inner portions of the isolation region, as well as overlying the outer edges of photodiode region 435. In some embodiments less than all of the photodiode region 435 is overlain by the polysilicon layer 455. Polysilicon layer 455 in some embodiments can be the transfer gate for pixel 400.

Figure 5:
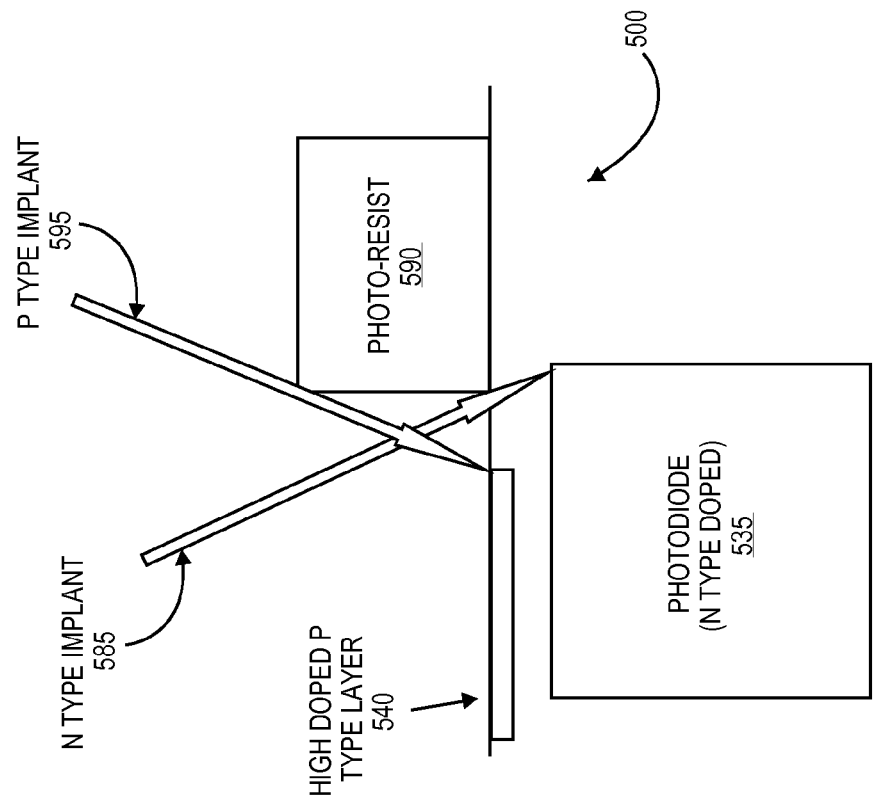
FIG. 5 is a cross-sectional view of self-aligning features of an imaging pixel of a backside illuminated imaging sensor, in accordance with an embodiment of the invention.

FIG. 5 is a cross-sectional view of self-aligning features of an imaging pixel 500 of a backside illuminated imaging sensor, in accordance with an embodiment of the invention. Imaging pixel 500 is one possible implementation of at least one pixel of pixel array 105 shown in FIG. 1. In accordance with the disclosure, the photodiode region 535 and a passivation layer (such as highly doped P-type layer 540) can be formed using self aligning techniques. The self-alignment feature minimizes differences in the relative positions of the photodiode region 535 and the highly doped P-type layer 540. For example, the photodiode region 535 can be formed using an N-type implant 585 wherein the ions are implanted at an oblique angle. When implanted at the illustrated oblique angle, the left margin of the photodiode region 535 lies underneath (the lower left corner of) the photo-resist 590. The highly doped P-type layer 540 can be formed using a P-type implant 595 wherein the ions are implanted at an oblique angle that is not parallel to—and is generally opposite from (with respect to a vertical axis)—the angle of the N-type implant 585). In addition to the minimized differences in the relative position of the photodiode region 535 and the highly doped P-type layer 540, the use of the self-aligning techniques reduces processing steps.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A backside illuminated ("BSI") imaging sensor, the BSI imaging sensor comprising:
   a photodiode region disposed within a semiconductor substrate layer having a backside and a frontside, wherein the photodiode region is sensitive to light incident through the backside;
   an insulation layer disposed on the frontside of the semiconductor substrate layer over the photodiode region;
   metal layers disposed over the frontside of the semiconductor substrate layer; and
   a light reflecting layer disposed on the insulation layer and positioned to reflect at least a portion of the light incident through the backside of the semiconductor substrate layer that passes through the photodiode region back towards the photodiode region, wherein the light reflecting layer comprises a transistor gate.

2. The BSI imaging sensor of claim 1, wherein the light reflecting layer forms the transistor gate of a transfer transistor for establishing a conductive channel between the photodiode region and a drain.

3. The BSI imaging sensor of claim 2, further comprising:
   an isolation region disposed within the semiconductor substrate layer for isolating adjacent pixels of the BSI imaging sensor, wherein the light reflecting layer extends horizontally to overlap a portion of the isolation region and a portion of the drain.

4. The BSI imaging sensor of claim 1, wherein the light reflecting layer extends horizontally across an entire frontside of the photodiode region.

5. The BSI imaging sensor of claim 1, wherein the insulation layer extends horizontally across an entire frontside of the photodiode region.

6. The BSI imaging sensor of claim 1, further comprising a pinning layer having a dopant polarity opposite of a dopant polarity of the photodiode region.

7. The BSI imaging sensor of claim 6, wherein the pinning layer is disposed between the insulation layer and the photodiode region along the frontside of the semiconductor substrate layer.

8. The BSI imaging sensor of claim 7, wherein the pinning layer extends horizontally to overlap at least a portion of the photodiode region.

9. The BSI imaging sensor of claim 1, wherein the light reflecting layer further comprises a silicide.

10. The BSI imaging sensor of claim 8, wherein the photodiode region is doped with N type dopants and the pinning layer is doped with P type dopants.

11. A backside illuminated (BSI) imaging pixel array, comprising:
    a photosensitive region disposed within a substrate layer having a backside and a frontside, wherein the photosensitive region is sensitive to light incident through the backside;
    an insulation layer disposed on the frontside of the substrate layer in a region that is over the photosensitive region, wherein the insulation layer is an oxide;
    metal layers disposed over the frontside of the substrate layer; and
    a silicide light reflecting layer positioned to reflect at least a portion of the light incident through the backside of the substrate layer that passes through the photosensitive region back towards the photosensitive region, wherein the silicide light reflecting layer is disposed on a transfer transistor gate positioned for transferring charge from the photosensitive region to a floating drain disposed within the substrate layer.

12. The BSI imaging pixel array of claim 11 further comprising a pinning layer disposed between a portion of the photosensitive region and the silicide light reflecting layer.

13. The BSI imaging pixel array of claim 11, wherein transfer transistor gate is disposed on the insulating layer and overlays at least a portion of the photosensitive region.

14. The BSI imaging pixel array of claim 13, further comprising:
    an isolation region disposed within the substrate layer for isolating adjacent pixels of the BSI imaging pixel array, wherein the silicide light reflecting layer and the transfer transistor gate extend horizontally to overlay a portion of the isolation region and a portion of the floating drain.

* * * * *